(12) United States Patent
Lee (10) Patent No.: US 12,320,862 B2
(45) Date of Patent: Jun. 3, 2025

(54) BATTERY MANAGEMENT SYSTEM, BATTERY PACK, ENERGY STORAGE SYSTEM AND BATTERY MANAGEMENT METHOD

(71) Applicant: LG ENERGY SOLUTION, LTD., Seoul (KR)

(72) Inventor: Hyun-Jun Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 398 days.

(21) Appl. No.: 17/790,391

(22) PCT Filed: Jul. 14, 2021

(86) PCT No.: PCT/KR2021/009065
§ 371 (c)(1),
(2) Date: Jun. 30, 2022

(87) PCT Pub. No.: WO2022/015062
PCT Pub. Date: Jan. 20, 2022

(65) Prior Publication Data
US 2023/0044388 A1 Feb. 9, 2023

(30) Foreign Application Priority Data
Jul. 15, 2020 (KR) .......................... 10-2020-0087749

(51) Int. Cl.
*G01R 31/396* (2019.01)
*G01R 31/3835* (2019.01)

(52) U.S. Cl.
CPC ....... *G01R 31/396* (2019.01); *G01R 31/3835* (2019.01)

(58) Field of Classification Search
CPC .. G01R 31/36–396; H01M 2010/4271; H01M 10/425; H01M 2220/10;
(Continued)

(56) References Cited

U.S. PATENT DOCUMENTS 9,658,291 B1 * 5/2017 Wang ................. G01R 31/3842
9,847,558 B1 * 12/2017 Wang ................. H01M 50/569
(Continued)

FOREIGN PATENT DOCUMENTS

CN 1692524 A 11/2005
CN 109375116 A 2/2019
(Continued)

OTHER PUBLICATIONS

International Search Report (PCT/ISA/210) issued in PCT/KR2021/009065, dated Nov. 1, 2021.

*Primary Examiner* — Shelby A Turner
*Assistant Examiner* — Yaritza H Perez Bermudez
(74) *Attorney, Agent, or Firm* — Birch, Stewart, Kolasch & Birch, LLP (57) ABSTRACT

A battery management system includes a voltage measurement circuit for generating a voltage signal indicating a cell voltage of each of a plurality of battery cells connected in series, and a controller. The controller determines an observation matrix including a plurality of observation voltage vectors indicating a voltage history of each of the plurality of battery cells in a moving window having a predetermined size based on the voltage signal. The controller determines a recovery matrix including a plurality of recovery voltage vectors corresponding to the plurality of observation voltage vectors in a one-to-one relationship. The controller detects an abnormality of each of the plurality of battery cells based on a plurality of absolute error vectors indicating a difference between the plurality of observation voltage vectors and the plurality of recovery voltage vectors.

11 Claims, 7 Drawing Sheets

(58) Field of Classification Search
CPC ..... H01M 10/48; H01M 10/482; Y02E 60/10; H02J 7/005
See application file for complete search history.

(56) References Cited

U.S. PATENT DOCUMENTS

| | | | |
|---|---|---|---|
| 10,424,961 B1* | 9/2019 | Maluf | H02J 7/00041 |
| 11,097,633 B1* | 8/2021 | Kohn | H02J 7/00 |
| 2005/0225289 A1 | 10/2005 | Iida et al. | |
| 2006/0197536 A1 | 9/2006 | Gandhi et al. | |
| 2007/0236182 A1 | 10/2007 | Plett | |
| 2012/0116722 A1 | 5/2012 | Yousfi-Steiner et al. | |
| 2014/0278169 A1 | 9/2014 | Kim | |
| 2015/0266390 A1* | 9/2015 | Shin | H02J 7/00 701/22 |
| 2016/0018472 A1* | 1/2016 | Sung | G01R 31/367 702/63 |
| 2016/0033582 A1* | 2/2016 | You | G01R 31/374 324/426 |
| 2020/0091562 A1 | 3/2020 | Mi et al. | |
| 2020/0091732 A1 | 3/2020 | Park | |
| 2020/0182939 A1 | 6/2020 | Ahn | |
| 2020/0355749 A1 | 11/2020 | Takahashi et al. | |
| 2020/0393518 A1 | 12/2020 | Takegami et al. | |
| 2021/0048480 A1 | 2/2021 | Lim et al. | |
| 2021/0325469 A1* | 10/2021 | Torai | G01R 31/3842 |
| 2022/0229119 A1* | 7/2022 | Jerschow | G01R 33/025 |

FOREIGN PATENT DOCUMENTS

| | | |
|---|---|---|
| JP | 2003-242484 A | 8/2003 |
| JP | 2005-78555 A | 3/2005 |
| JP | 2012-530925 A | 12/2012 |
| JP | 2013-195129 A | 9/2013 |
| JP | 2014-59270 A | 4/2014 |
| JP | 2019-20174 A | 2/2019 |
| JP | 2019-146302 A | 8/2019 |
| JP | 2019-184581 A | 10/2019 |
| JP | 2019-211248 A | 12/2019 |
| KR | 10-2014-0111920 A | 9/2014 |
| KR | 10-2016-0010132 A | 1/2016 |
| KR | 10-2016-0014940 A | 2/2016 |
| KR | 10-2017-0051059 A | 5/2017 |
| KR | 10-2019-0093409 A | 8/2019 |
| KR | 10-2019-0123172 A | 10/2019 |
| WO | WO 2019/138286 A1 | 7/2019 |

* cited by examiner

BATTERY MANAGEMENT SYSTEM, BATTERY PACK, ENERGY STORAGE SYSTEM AND BATTERY MANAGEMENT METHOD

TECHNICAL FIELD

The present application claims the benefit of Korean Patent Application No. 10-2020-0087749 filed on Jul. 15, 2020 with the Korean Intellectual Property Office, the disclosure of which is incorporated herein by reference in its entirety.

The present disclosure relates to abnormality detection of a battery cell.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be charged and discharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

Recently, with the widespread of application requiring high voltage, a battery pack including a plurality of battery cells connected in series is widely used. As the number of battery cells included in the battery pack increases, there is an increasing likelihood that an abnormality of the battery cell occurs. Accordingly, there is a growing need for diagnosis technology for accurately detecting an abnormality of the battery cell.

The related art monitors cell information (for example, voltage, current, temperature) including a plurality of parameters associated with the state of the battery cell, and detects an abnormality of the battery cell based on the operational state (for example, charge, discharge, rest) and the monitored cell information of the battery cell.

However, this abnormality detection method requires a battery management system (BMS) to monitor the cell information of the battery cell using a plurality of sensors, so abnormality detection requires a large amount of computation and a long time. In particular, under the structure in which the power of the BMS is supplied from the battery cell, the electrical energy of the battery cell may be consumed all the time during the operation of the BMS for abnormality detection.

Moreover, the related art detects an abnormality of the battery cell based on the rapid changes in the cell information of the battery cell in a short time. However, the cell information of the defective battery cell does not always rapidly change in a short time, and may tend to slowly change over a long period of time, so an abnormality of the battery cell may not be detected at a proper time.

DISCLOSURE

Technical Problem

The present disclosure is designed to solve the above-described problem, and therefore the present disclosure is directed to providing a battery management system, a battery management method, a battery pack and an energy storage system using a cell voltage of each of a plurality of battery cells included in a battery pack as a single parameter for abnormality detection.

The present disclosure is further directed to providing a battery management system, a battery management method, a battery pack and an energy storage system that generates an observation matrix which is a dataset including a plurality of observation voltage vectors indicating a change in cell voltage of each of a plurality of battery cells, recovers the observation matrix using at least one of a plurality of principal components of the observation matrix, and accurately detects an abnormality of each battery cell from a difference between a dataset before the recovery and a dataset after the recovery.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

A battery management system according to an aspect of the present disclosure is for detecting an abnormality of each of a plurality of battery cells connected in series. The battery management system includes a voltage measurement circuit configured to generate a voltage signal indicating a cell voltage of each battery cell, and a controller. The controller is configured to determine an observation matrix including a plurality of observation voltage vectors indicating a voltage history of each of the plurality of battery cells measured multiple times in time series in a moving window having a predetermined size based on the voltage signal. The controller is configured to determine a recovery matrix including a plurality of recovery voltage vectors corresponding to the plurality of observation voltage vectors in a one-to-one relationship. The controller is configured to determine a plurality of absolute error vectors indicating a difference between the plurality of observation voltage vectors and the plurality of recovery voltage vectors. The controller is configured to detect an abnormality of each of the plurality of battery cells based on the plurality of absolute error vectors.

The controller may be configured to extract a first sub-matrix, a second sub-matrix and a third sub-matrix from the observation matrix using a matrix decomposition algorithm. The first sub-matrix is an orthogonal matrix including a plurality of principal component vectors indicating variance information of the observation matrix. The second sub-matrix is a diagonal matrix including a plurality of singular values indicating descriptive factor information of the plurality of principal component vectors for the variance information. The third sub-matrix is an orthogonal matrix including a plurality of coefficient vectors indicating dependency information of the plurality of observation voltage vectors on the plurality of principal component vectors. The controller may be configured to select at least one of the plurality of singular values using a predetermined recovery condition. The controller may be configured to transform the first sub-matrix, the second sub-matrix and the third sub-matrix into a first approximating matrix, a second approximating matrix and a third approximating matrix based on the at least one selected singular value. The controller may be configured to determine the plurality of recovery voltage vectors by multiplying the first approximating matrix, the second approximating matrix and the third approximating matrix.

The controller may be configured to select each of a threshold number of singular values from the plurality of singular values in a descending order.

The controller may be configured to select first to kth singular values from the plurality of singular values when a ratio of the kth singular value to the sum of the plurality of singular values is equal to or larger than a first threshold ratio and a ratio of a uth singular value to the sum of the plurality of singular values is less than the first threshold ratio. k is a natural number of less than n, u is k+1, n is a total number of the plurality of battery cells, and the kth singular value is a kth largest singular value among the plurality of singular values.

The controller may be configured to select first to qth singular values from the plurality of singular values when a ratio of the sum of the first to qth singular values to the sum of the plurality of singular values is equal to or larger than a second threshold ratio and a ratio of the sum of the first to pth singular values to the sum of the plurality of singular values is less than the second threshold ratio. q is a natural number of 2 or greater and less than n, p is q−1, n is a total number of the plurality of battery cells, and the qth singular value is a qth largest singular value among the plurality of singular values.

The controller may be configured to detect that each battery cell corresponding to each absolute error vector including at least one component outside of a predetermined absolute error range among the plurality of absolute error vectors is defective.

The controller may be configured to determine a relative error range based on the plurality of absolute error vectors. The controller may be configured to detect that each battery cell corresponding to each absolute error vector including at least one component outside of the relative error range among the plurality of absolute error vectors is defective.

The controller may be configured to output a fault message indicating a recovery impossible situation when a ratio of a maximum value to a minimum value among the plurality of singular values is less than a preset ratio.

A battery pack according to another aspect of the present disclosure includes the battery management system.

An energy storage system according to still another aspect of the present disclosure includes the battery pack.

A battery management method according to yet another aspect of the present disclosure is for detecting an abnormality of each of a plurality of battery cells connected in series. The battery management method includes determining an observation matrix including a plurality of observation voltage vectors indicating a voltage of each of the plurality of battery cells measured multiple times in time series in a moving window having a predetermined size, determining a recovery matrix including a plurality of recovery voltage vectors corresponding to the plurality of observation voltage vector in a one-to-one relationship, determining a plurality of absolute error vectors indicating a difference between the plurality of observation voltage vectors and the plurality of recovery voltage vectors, and detecting an abnormality of each of the plurality of battery cells based on the plurality of absolute error vectors.

Advantageous Effects

According to at least one of the embodiments of the present disclosure, only the cell voltage except the current or the temperature is used to detect an abnormality of each of a plurality of battery cells included in a battery pack, thereby reducing the amount of computation, time and power required for abnormality detection.

According to at least one of the embodiments of the present disclosure, in detecting an abnormality of each battery cell, after generating an observation matrix which is a dataset including a plurality of observation voltage vectors indicating a time-dependent change in cell voltage of each of the plurality of battery cells, and recovering the observation matrix using at least one of the plurality of principal components of the observation matrix, an abnormality of each of the plurality of battery cells may be accurately detected using a difference between a dataset before the recovery and a dataset after the recovery.

The effects of the present disclosure are not limited to the effects mentioned above, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and this may be implemented by hardware and software either alone or in combination.

In addition, throughout the specification, it will be further understood that when an element is referred to as being "connected to" another element, it can be directly connected to the other element or intervening elements may be present.

Figure 1:
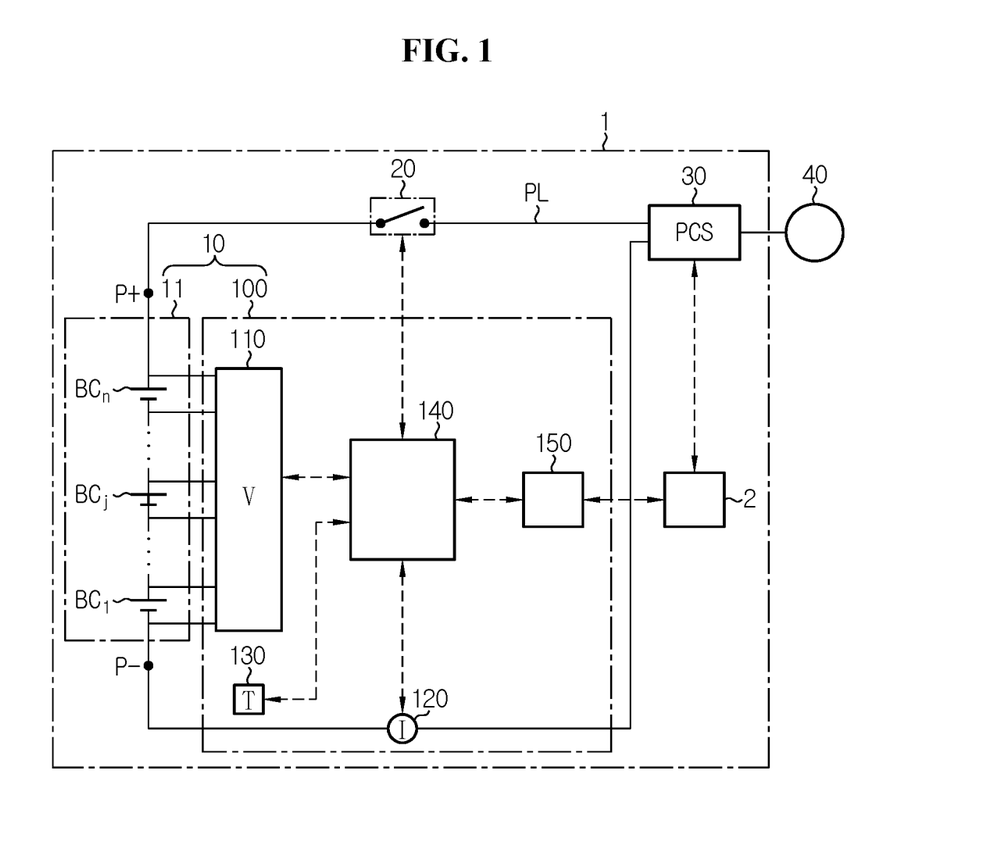
FIG. 1 is a diagram exemplarily showing a configuration of an energy storage system according to the present disclosure.

FIG. 1 is a diagram exemplarily showing a configuration of an energy storage system 1 according to the present disclosure.

Referring to FIG. 1, the energy storage system 1 includes a battery pack 10, a switch 20 and a power conversion system 30.

The battery pack 10 includes a positive terminal P+, a negative terminal P−, a cell group 11 and a battery management system 100. The cell group 11 includes a plurality of battery cells $BC_1$~$BC_n$ electrically connected in series between the positive terminal P+ and the negative terminal P−. The reference sign 'n' is a natural number of 2 or greater indicating the total number of battery cells. Hereinafter, in providing the description in common to the plurality of battery cells $BC_1$~$BC_n$, the reference sign 'BC' is used to indicate a battery cell.

The positive terminal and the negative terminal of each battery cell BC are electrically coupled to another battery cell BC through a conductor such as a busbar. The battery cell BC may be a lithium ion battery cell. The battery cell BC is not limited to a particular type and includes any type of battery cell that can be repeatedly recharged.

The switch 20 is installed on a power line PL for the battery pack 10. While the switch 20 is on, power transfer from any one of the battery pack 10 and the power conversion system 30 to the other is possible. The switch 20 may be implemented as at least one of well-known switching devices such as a relay and a Field Effect Transistor (FET). A control unit 140 may control the on/off of the switch 20 according to the condition of the cell group 11.

The power conversion system 30 is operably coupled to the battery management system 100 through a high level controller 2. Operably coupled refers to directly/indirectly connected to transmit and receive a signal in one or two directions. The power conversion system 30 may produce the direct current power for the charge of the cell group 11 from the alternating current power supplied by an electrical grid 40. The power conversion system 30 may produce the alternating current power from the direct current power from the battery pack 10.

The battery management system 100 includes a voltage measurement circuit 110 and the control unit 140. The battery management system 100 may further include at least one of a current sensor 120, a temperature sensor 130 or an interface unit 150.

The voltage measurement circuit 110 is provided to be electrically connectable to the positive terminal and the negative terminal of each battery cell BC. The voltage measurement circuit 110 is configured to measure a voltage across each battery cell BC and output a signal indicating the measured voltage to the control unit 140.

The current sensor 120 is electrically connected in series to the cell group 11 through the power line PL. For example, a shunt resistor or a hall effect device may be used as the current sensor 120. The current sensor 120 is configured to measure a current flowing through the cell group 11, and output a signal indicating the measured current to the control unit 140.

The temperature sensor 130 is disposed in a predetermined distance range from the cell group 11. For example, a thermocouple may be used as the temperature sensor 130. The temperature sensor 130 is configured to measure a temperature of the cell group 11, and output a signal indicating the measured temperature to the control unit 140.

The control unit 140 is operably coupled to the switch 20, the voltage measurement circuit 110, the current sensor 120, the temperature sensor 130 and/or the interface unit 150.

The control unit 140 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing other functions.

The control unit 140 may have a memory embedded therein. The memory may pre-store a variety of programs and data necessary to perform battery management methods according to embodiments as described below. The memory may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM).

The interface unit 150 may be coupled to the high level controller 2 of the energy storage system 1 to enable communication. The interface unit 150 may transmit a message from the high level controller 2 to the control unit 140 and a message from the control unit 140 to the high level controller 2. The message from the control unit 140 may include information for notifying an abnormality of each battery cell BC. The communication between the interface unit 150 and the high level controller 2 may use, for example, a wired network such as local area network (LAN), controller area network (CAN) and a daisy chain and/or a near-field wireless network such as Bluetooth, Zigbee and Wi-Fi. The interface unit 150 may include an output device (for example, a display, a speaker) to provide the information received from the control unit 140 and/or the high level controller 2 in a recognizable format. The high level controller 2 may control the power conversion system 30 based on cell information (for example, cell voltage, current, temperature, SOC, abnormality of each battery cell) collected through communication with the battery management system 100.

The control unit 140 may execute a diagnosis mode for detecting an abnormality of the plurality of battery cells $BC_1$~$BC_n$. The period of time during which the control unit 140 executes the diagnosis mode may be referred to as a 'diagnosis period'. The control unit 140 may execute the diagnosis mode while the cell group 11 is kept in a predetermined diagnosable state (for example, resting state, constant current charging state, constant voltage charging state).

Figure 2:
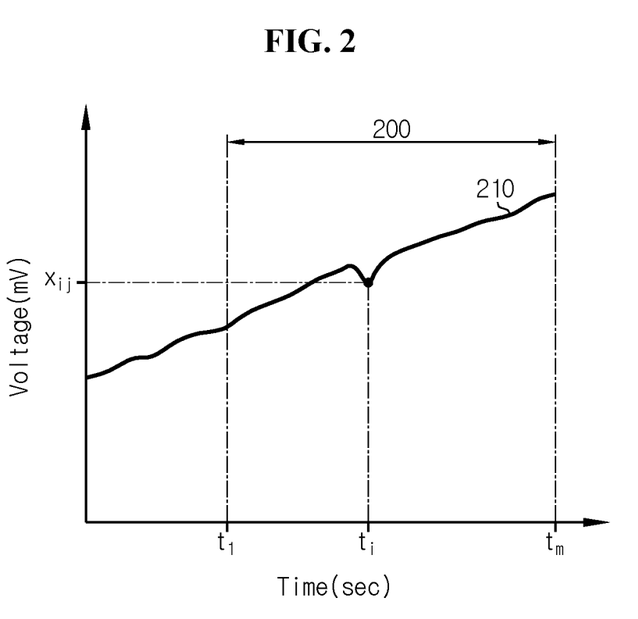
FIG. 2 is a graph exemplarily showing a change in cell voltage of a battery cell over time.
Figure 3:
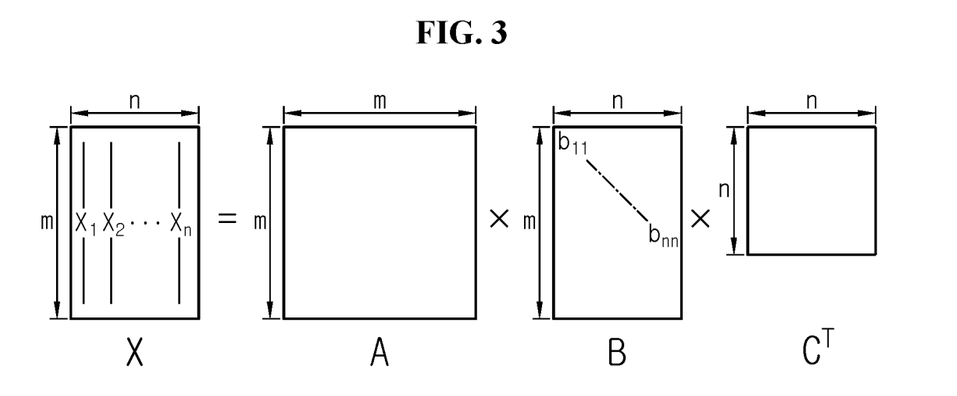
FIG. 3 is a diagram referenced in describing an exemplary observation matrix as a dataset indicating a voltage history of a battery cell shown in FIG. 2.

FIG. 2 is a graph exemplarily showing a change in cell voltage of the battery cell over time, and FIG. 3 is a diagram referenced in describing an exemplary observation matrix as a dataset indicating a voltage history of the battery cell shown in FIG. 2.

The control unit 140 determines a voltage value of a cell voltage of each of the plurality of battery cells $BC_1 \sim BC_n$ at a preset time interval based on the voltage signal from the voltage measurement circuit 110 and records the determined voltage value in the memory. The preset time interval may be equal to a time length of an abnormality detection period (timing) as described below.

The control unit 140 determines an observation matrix X including a plurality of observation voltage vectors $X_1 \sim X_n$ indicating a change in cell voltage of each of the plurality of battery cells $BC_1 \sim BC_n$ measured at the preset time interval in a moving window 200 having a predetermined size using the moving window 200. The size of the moving window 200 may be preset or adjustable by the control unit 140.

In the moving window 200, the cell voltage of the battery cell BC may be measured by the voltage measurement circuit 110 m times (m is a natural number of 2 or greater) in time series, and the measured cell voltages may be recorded in the memory by the control unit 140. For example, when the size of the moving window 200=200 sec and the time interval=1 sec, m=200, and thus the cell voltage of each battery cell BC is measured 200 times in the moving window 200.

Referring to FIG. 2, a curve 210 exemplarily shows a change in cell voltage of the $j^{th}$ battery cell $BC_j$ among the plurality of battery cells $BC_1 \sim BC_n$ over time. In FIG. 2, $t_1$ and $t_m$ are the start time and the ending time point of the moving window 200, respectively. The curve 210 may be based on the cell voltage measured when the $j^{th}$ battery cell $BC_j$ is in a defective state. The defective state may be, for example, a state that triggers an abnormal behavior of cell voltage, such as an internal short circuit.

Hereinafter, an abnormality detection operation according to the present disclosure will be described on the basis of the $j^{th}$ battery cell $BC_j$. The description of the $j^{th}$ battery cell $BC_j$ may be applied in common to the remaining battery cells BC of the plurality of battery cells $BC_1 \sim BC_n$.

Referring to FIG. 3, the observation matrix X is an m×n matrix including m rows and n columns. Hereinafter, for convenience of description, assume that m is larger than n, i is a natural number of 1 or greater and m or smaller, and j is a natural number of 1 or greater and n or smaller.

The n column vectors of the observation matrix X may correspond to the plurality of observation voltage vectors $X_1 \sim X_n$ in a one-to-one relationship. That is, each of the plurality of observation voltage vectors $X_1 \sim X_n$ is a column vector of the observation matrix X having m elements (measured cell voltages). The $j^{th}$ observation voltage vector $X_j$ is a time-series array of cell voltages of the $j^{th}$ battery cell $BC_j$ measured m times in the moving window 200, that is, a time series of the measured cell voltages of the $j^{th}$ battery cell $BC_j$. The $j^{th}$ observation voltage vector $X_j$ may be the $j^{th}$ column vector of the observation matrix X. Referring to FIG. 2, in the observation matrix X, '$x_{ij}$' is an element (may be referred to as 'data' or 'component') indicating the cell voltage the $j^{th}$ battery cell $BC_j$ measured at the $i^{th}$ time in the moving window 200. That is, $x_{ij}$ may be the measured cell voltage of the $j^{th}$ battery cell $BC_j$ indexed to the $i^{th}$ measurement time of the moving window 200.

The control unit 140 may extract a first sub-matrix A, a second sub-matrix B and a third sub-matrix $C^T$ from the observation matrix X using matrix decomposition. A matrix decomposition algorithm may include, for example, Singular Value Decomposition (SVD) and Principal Component Analysis (PCA). In the specification, the superscript 'T' on the right side of the matrix indicates a transposed matrix. As shown, the product of multiplying the first sub-matrix A, the second sub-matrix B and the third sub-matrix $C^T$ is equal to the observation matrix X.

The first sub-matrix A is an m×m matrix. The second sub-matrix B is an m×n matrix. The third sub-matrix $C^T$ is an n×n matrix.

The first sub-matrix A is an orthogonal matrix, and includes a plurality of principal component vectors $A_1 \sim A_m$. Each principal component vector of the plurality of principal component vectors $A_1 \sim A_m$ may be referred to as a 'left singular vector', and may be a column vector of the first sub-matrix A having m elements. That is, the first sub-matrix A may be expressed below.

$$A=[A_1 A_2 \ldots A_m], A_i=[a_{1i} a_{2i} \ldots a_{mi}]^T$$

Among the plurality of principal component vectors $A_1 \sim A_m$, the principal component vectors $A_1 \sim A_n$ indicate variance information of the observation matrix X. The remaining principal component vectors $A_{n+1} \sim A_m$ of the plurality of principal component vectors $A_1 \sim A_m$ may be redundant in describing the variance information of observation vectors X. The $j^{th}$ principal component vector $A_j$ corresponds to an axial direction in which the variance of elements of the observation matrix X is the $j^{th}$ largest one. That is, when the elements of the observation matrix X are mapped to the axis of each of the plurality of principal component vectors $A_1 \sim A_m$ once, the variance of elements of the observation matrix X along the axis of the $j^{th}$ principal component vector $A_j$ may be the $j^{th}$ largest.

As the magnitude of the variance of the $j^{th}$ principal component vector $A_j$ is larger, it indicates that the $j^{th}$ principal component vector $A_j$ has a larger descriptive factor for a distribution of elements of the observation matrix X. As the descriptive factor of the $j^{th}$ principal component vector $A_j$ increases, the $j^{th}$ principal component vector $A_j$ contains a larger amount of information associated with the common voltage behavior characteristics (for example, normal voltage behavior characteristics) of the plurality of battery cells $BC_1 \sim BC_n$ in the moving window 200. On the contrary, as the magnitude of the variance of the $j^{th}$ principal component vector $A_j$ is smaller, the descriptive factor is lower, that is, the $j^{th}$ principal component vector $A_j$ contains a larger amount of information associated with noisy characteristics (for example, a defective state).

The second sub-matrix B is a diagonal matrix, and includes a plurality of singular values $b_{11} \sim b_{nn}$ as an element of a principal diagonal. That is, the second sub-matrix B may be expressed below.

$$B=[B_1 B_2 \ldots B_n], B_j=[b_{1j} b_{2j} \ldots b_{mj}]^T$$

Where i≠j, $b_{ij}$ is 0. $b_{jj}$ is the $j^{th}$ singular value.

That is, the value of elements except n elements of the principal diagonal among the total of m×n elements of the second sub-matrix B is 0. The singular value $b_{jj}$ of the second sub-matrix B indicates the descriptive factor of the $j^{th}$ principal component vector $A_j$. The plurality of singular values $b_{11} \sim b_{nn}$ may satisfy the following relationship: $b_{11} \geq b_{22} \geq \ldots \geq b_{nn} \geq 0$. That is, the plurality of singular values $b_{11} \sim b_{nn}$ may be referred to as first to $n^{th}$ singular values in the descending order, and $b_{jj}$ may be the $j^{th}$ largest singular value among the plurality of singular values $b_{11} \sim b_{nn}$.

The plurality of singular values $b_{11} \sim b_{nn}$ indicates the descriptive factor information of the plurality of principal component vectors $A_1 \sim A_n$.

The third sub-matrix $C^T$ is an orthogonal matrix, and includes a plurality of coefficient vectors $C_1^T \sim C_n^T$. Each of the plurality of coefficient vectors $C_1^T \sim C_n^T$ may be referred to as a 'right singular vector', and may be a row vector of the third sub-matrix $C^T$ having n components. The third sub-matrix $C^T$ may be expressed below.

$$C^T = [C_1 C_2 \ldots C_n]^T = [C_1^T; C_2^T; \ldots; C_n^T]$$

The plurality of coefficient vectors $C_1^T \sim C_n^T$ indicates dependency information of the plurality of observation voltage vectors $X_1 \sim X_n$ on the plurality of principal component vectors $A_1 \sim A_n$. That is, how much the cell voltage of the $j^{th}$ battery cell $BC_j$ is affected by the $j^{th}$ principal component vector $A_j$ among the plurality of principal component vectors $A_1 \sim A_n$ is set by the $j^{th}$ coefficient vector $C_j^T$.

The observation matrix X may be equal to the product of multiplying the first sub-matrix A, the second sub-matrix B and the third sub-matrix $C^T$, and satisfy the relationship by the following Equation 1.

$$X = [X_1 X_2 \ldots X_n] = \sum_{j=1}^{n} (b_{jj} \times A_j \times C_j^T) \quad \langle\text{Equation 1}\rangle$$

In Equation 1, $A_j$ is treated as a (m×1) matrix, and $C_j^T$ is treated as a (1×n) matrix.

The control unit 140 determines a plurality of recovery voltage vectors $X_1' \sim X_n'$ corresponding to the plurality of observation voltage vectors $X_1 \sim X_n$ in a one-to-one relationship based on the plurality of observation voltage vectors $X_1 \sim X_n$.

Specifically, the control unit 140 selects the number of singular value of 1 or greater and less than n satisfying predetermined recovery condition(s) from the plurality of singular values $b_{11} \sim b_{nn}$. The recovery condition is for obtaining at least one singular value to be used to approximate (recover) the observation matrix X among n singular values $b_{11} \sim b_{nn}$. The recovery condition may be as follows.

(1) a threshold number of singular values among the plurality of singular values $b_{11} \sim b_{nn}$ in the descending order For example, when the threshold number is r which is a natural number of less than n, singular values $b_{11} \sim b_{rr}$ may be selected from the plurality of singular values $b_{11} \sim b_{nn}$.

(2) singular values having a ratio (the descriptive factor) to the total sum of the plurality of singular values $b_{11} \sim b_{nn}$ that is equal to or larger than a first threshold ratio (for example, 0.04)

For example, k is a natural number of less than n, where u=k+1, $b_{kk}/(b_{11}+b_{22}+ \ldots +b_{nn}) \geq$ first threshold ratio $> b_{uu}/(b_{11}+b_{22}+ \ldots +b_{nn})$, singular values $b_{11} \sim b_{kk}$ may be selected.

(3) a ratio of a partial sum of the plurality of singular values $b_{11} \sim b_{nn}$ in the descending order to the total sum of the plurality of singular values $b_{11} \sim b_{nn}$ that is equal to or larger than a second threshold ratio (for example, 0.997)

For example, q is a natural number of less than n and 2 or greater, where p=q−1, $(b_{11}+b_{22}+ \ldots +b_{pp}+b_{qq})/(b_{11}+b_{22}+ \ldots +b_{nn}) \geq$ second threshold ratio $> (b_{11}+b_{22}+ \ldots +b_{pp})/(b_{11}+b_{22}+ \ldots +b_{nn})$, singular values $b_{11} \sim b_{qq}$ may be selected.

When at least one singular value satisfying at least one of the above-described recovery conditions (1), (2) and (3) is selected, the control unit 140 may determine the plurality of recovery voltage vectors $X_1' \sim X_n'$ by approximating the plurality of observation voltage vectors $X_1 \sim X_n$ using a set of selected singular values.

Prior to selecting the singular values satisfying the recovery condition(s), the control unit 140 may calculate a ratio of a maximum value $b_{11}$ to a minimum value $b_{nn}$ of the plurality of singular values $b_{11} \sim b_{nn}$. When the ratio of the maximum value $b_{11}$ to the minimum value $b_{nn}$ is less than a predetermined ratio (for example, 200%), the control unit 140 may output a fault message indicating a recovery impossible situation. The recovery impossible situation is a situation in which there is no explicit difference in descriptive factor between the plurality of principal component vectors $A_1 \sim A_n$. That is, in the recovery impossible situation, none of the plurality of principal component vectors $A_1 \sim A_n$ sufficiently includes information associated with the common voltage behavior characteristics of the plurality of battery cells $BC_1 \sim BC_n$. The cause of the recovery impossible situation may be, for example, a malfunction of the voltage measurement circuit and an abnormality in the number of battery cells BC exceeding a predetermined ratio among the plurality of battery cells $BC_1 \sim BC_n$.

When the ratio of the maximum value $b_{11}$ to the minimum value $b_{nn}$ is less than the predetermined ratio, the control unit 140 may increase the size of the moving window 200 by a predetermined time in the next cycle. The reason of increasing the size of the moving window 200 is to sufficiently reflect the common voltage behavior characteristics of the plurality of battery cells $BC_1 \sim BC_n$ in the observation vectors X.

Hereinafter, when w is a natural number of less than n, it is assumed that the singular values $b_{11} \sim b_{ww}$ are selected from the plurality of singular values $b_{11} \sim b_{nn}$ by the recovery condition(s). Each of the singular values $b_{11} \sim b_{ww}$ selected from the plurality of singular values $b_{11} \sim b_{nn}$ may be referred to as a singular value of interest. The remaining singular values except the singular value of interest among the plurality of singular values $b_{11} \sim b_{nn}$ are singular values having less correlation with the common voltage behavior characteristics of the plurality of battery cells $BC_1 \sim BC_n$.

Figure 4:
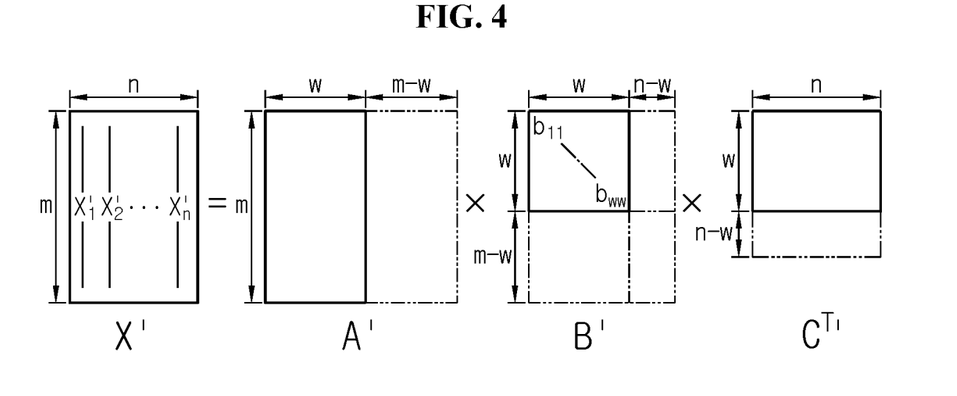
FIG. 4 is a diagram referenced in describing an exemplary recovery matrix as a result of recovering the observation matrix of FIG. 3.
Figure 5:
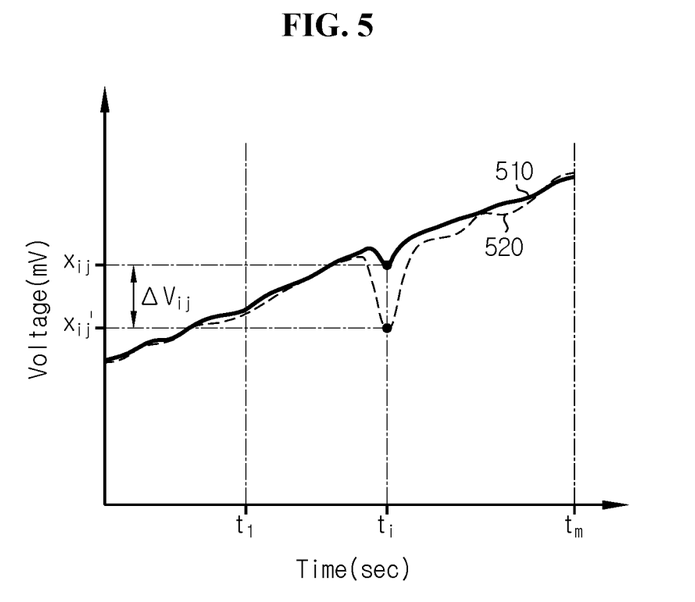
FIG. 5 is a diagram referenced in describing a voltage change indicated by an observation matrix and a voltage change indicated by a recovery matrix.
Figure 6:
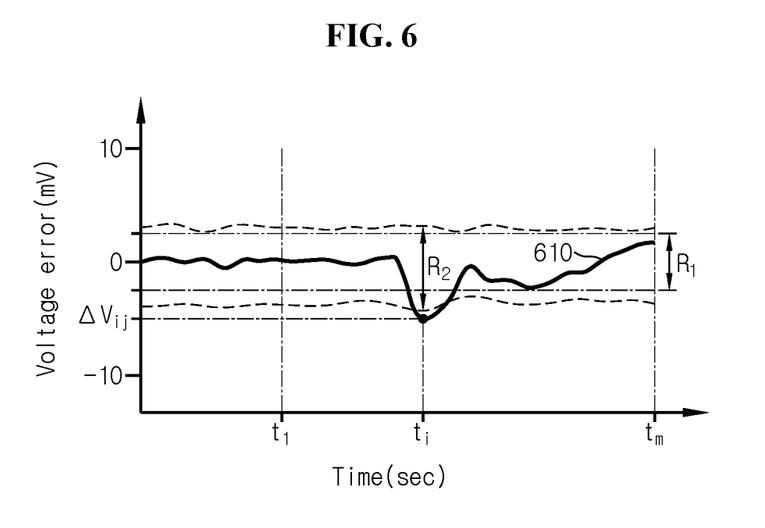
FIG. 6 is a diagram referenced in describing an error between the observation matrix and the recovery matrix shown in FIG. 5.

FIG. 4 is a diagram referenced in describing an exemplary recovery matrix as a result of recovering the observation matrix of FIG. 3, FIG. 5 is a diagram referenced in describing a voltage change indicated by the observation matrix and a voltage change indicated by the recovery matrix, and FIG. 6 is a diagram referenced in describing an error between the observation matrix and the recovery matrix shown in FIG. 5.

Referring to FIG. 4, the control unit 140 may transform the first sub-matrix A, the second sub-matrix B and the third sub-matrix $C^T$ into a first approximating matrix A', a second approximating matrix B' and a third approximating matrix $C^{T\prime}$ based on the singular values of interest $b_{11} \sim b_{ww}$.

The first approximating matrix A' is an m×w matrix including each of first to $w^{th}$ principal component vectors $A_1 \sim A_w$ of the first sub-matrix A as a column vector. That is, the first approximating matrix A' is the result of removing the principal component vectors $A_{w+1} \sim A_n$ from the first sub-matrix A.

The second approximating matrix B' is a w×w matrix including the singular values of interest $b_{11} \sim b_{ww}$ as the principal diagonal component. That is, the second approximating matrix B' is the result of changing the remaining principal diagonal components of the second sub-matrix B except the singular values of interest $b_{11} \sim b_{ww}$ to 0.

The third approximating matrix $C^{T'}$ is a w×n matrix including each of first to $w^{th}$ coefficient vectors $C_1^T \sim C_w^T$ of the third sub-matrix $C^T$ as a row vector. That is, the third approximating matrix $C^{T'}$ is the result of removing the row vectors $C_{w+1}^T \sim C_n^T$ from the third sub-matrix $C^T$.

The control unit 140 may determine the plurality of recovery voltage vectors $X_1' \sim X_n'$ based on the first approximating matrix A', the second approximating matrix B' and the third approximating matrix $C^{T'}$. Specifically, the control unit 140 may determine the recovery matrix X' by multiplying the first approximating matrix A', the second approximating matrix B' and the third approximating matrix $C^{T'}$. The recovery matrix X' is the result of recovering the observation matrix X using only the first to $w^{th}$ principal component vectors $A_1 \sim A_w$ corresponding to the singular values of interest $b_{11} \sim b_{ww}$ among the first to mm principal component vectors $A_1 \sim A_m$.

The recovery matrix X' is an m×n matrix, and includes the plurality of recovery voltage vectors $X_1' \sim X_n'$ as a column vector. The recovery matrix X' may satisfy the relationship by the following Equation 2.

$$X' = [X_1' X_2' \ldots X_n'] = \sum_{j=1}^{w}(b_{jj} \times A_j \times C_j^T) \quad \langle\text{Equation 2}\rangle$$

In Equation 2, $A_j$ is treated as an (mx 1) matrix, and $C_j^T$ is treated as a (1×n) matrix.

The control unit 140 detects an abnormality of the $j^{th}$ battery cell $BC_j$ based on the observation voltage vector $X_j$ and the recovery voltage vector $X_j'$ corresponding to each other.

Referring to FIG. 5, a curve 510 indicates a change in the cell voltage of the $j^{th}$ battery cell $BC_j$ over time, and is equal to the curve 210 of FIG. 2. A curve 520 indicates a change in the cell voltage of the $j^{th}$ battery cell $BC_j$ indicated by the recovery voltage vector $X_j'$ over time.

The control unit 140 may determine first to $n^{th}$ absolute error vectors corresponding to the first to $n^{th}$ battery cells $BC_1 \sim BC_n$ in a one-to-one relationship. The $j^{th}$ absolute error vector corresponds to a difference between the $j^{th}$ observation voltage vector $X_j$ and the $j^{th}$ recovery voltage vector $X_j'$. A curve 610 of FIG. 6 indicates the $j^{th}$ absolute error vector. That is, the curve 610 indicates a change in difference between the curve 510 and the curve 520 over time.

The $j^{th}$ absolute error vector 610 includes each of first to $m^{th}$ voltage differences $\Delta V_{1j} \sim \Delta V_{mj}$ as a component. The $i^{th}$ voltage difference $\Delta V_{ij}$ is $x_{ij} - x_{ij}'$, i.e., a difference between the $i^{th}$ element $x_{ij}$ of the observation voltage vector $X_j$ and the $i^{th}$ element $x_{ij}'$ of the recovery voltage vector $X_j'$. The $i^{th}$ element $x_{ij}$ indicates the cell voltage of the $j^{th}$ battery cell $BC_j$ measured at the $i^{th}$ time in the moving window 200. The $i^{th}$ element $x_{ij}'$ indicates the recovery result of the $i^{th}$ element $x_{ij}$.

The control unit 140 may determine a relative error range $R_2$ every measurement timing of cell voltage in the moving window 200 based on the first to $n^{th}$ absolute error vectors.

In each measurement timing (for example, time point $t_i$), the median of the relative error range $R_2$ may be an average of the elements of the first to $n^{th}$ absolute error vectors indexed to the corresponding measurement timing. The upper limit of the relative error range $R_2$ may be a value obtained by adding the product of multiplying the standard deviation of the elements of the first to $n^{th}$ absolute error vectors by a predetermined weight (for example, 3) to the median. The lower limit of the relative error range $R_2$ may be a value obtained by subtracting the product of multiplying the standard deviation of the components of the first to $n^{th}$ absolute error vectors by a predetermined weight (for example, 3) from the median. For example, assume weight=3, and $\sigma_i$ is the standard deviation of the components of the first to $n^{th}$ absolute error vectors indexed to the time point $t_i$. At the time point $t_i$, the median of the relative error range $R_2 = (\Delta V_{i1} + \Delta V_{i2} + \ldots + \Delta V_{in})/n = \Delta V_i$, the upper limit of the relative error range $R_2 = \Delta V_i + 3\sigma_i$, and the lower limit of the relative error range $R_2 = \Delta V_i - 3\sigma_i$.

The control unit 140 may determine whether the $j^{th}$ battery cell $BC_j$ is defective by comparing each element of the $j^{th}$ absolute error vector with at least one of a predetermined absolute error range $R_1$ or the relative error range $R_2$.

In an example, when at least one of the first to mm elements $\Delta V_{1j} \sim \Delta V_{mj}$ of the $j^{th}$ absolute error vector is outside of the absolute error range $R_1$, the control unit 140 may detect that the $j^{th}$ battery cell $BC_j$ is defective. The absolute error range $R_1$ may be preset to −1.0~1.0 mV considering the voltage resolution of the voltage measurement circuit 110.

In another example, the control unit 140 detect that the $j^{th}$ battery cell $BC_j$ is defective when at least one of the first to mm elements $\Delta V_{1j} \sim \Delta V_{mj}$ of the $j^{th}$ absolute error vector is outside of the relative error range $R_2$.

In still another example, the control unit 140 may detect that the $j^{th}$ battery cell $BC_j$ is defective when at least one of the first to mm elements $\Delta V_{1j} \sim \Delta V_{mj}$ of the $j^{th}$ absolute error vector is outside of the absolute error range $R_1$ and the relative error range $R_2$ at the same time.

When an abnormality of at least one battery cell BC is detected, the control unit 140 may execute a predetermined protection operation. For example, when the $j^{th}$ battery cell $BC_j$ is determined to be defective, the control unit 140 may turn off the switch 20.

Figure 7:
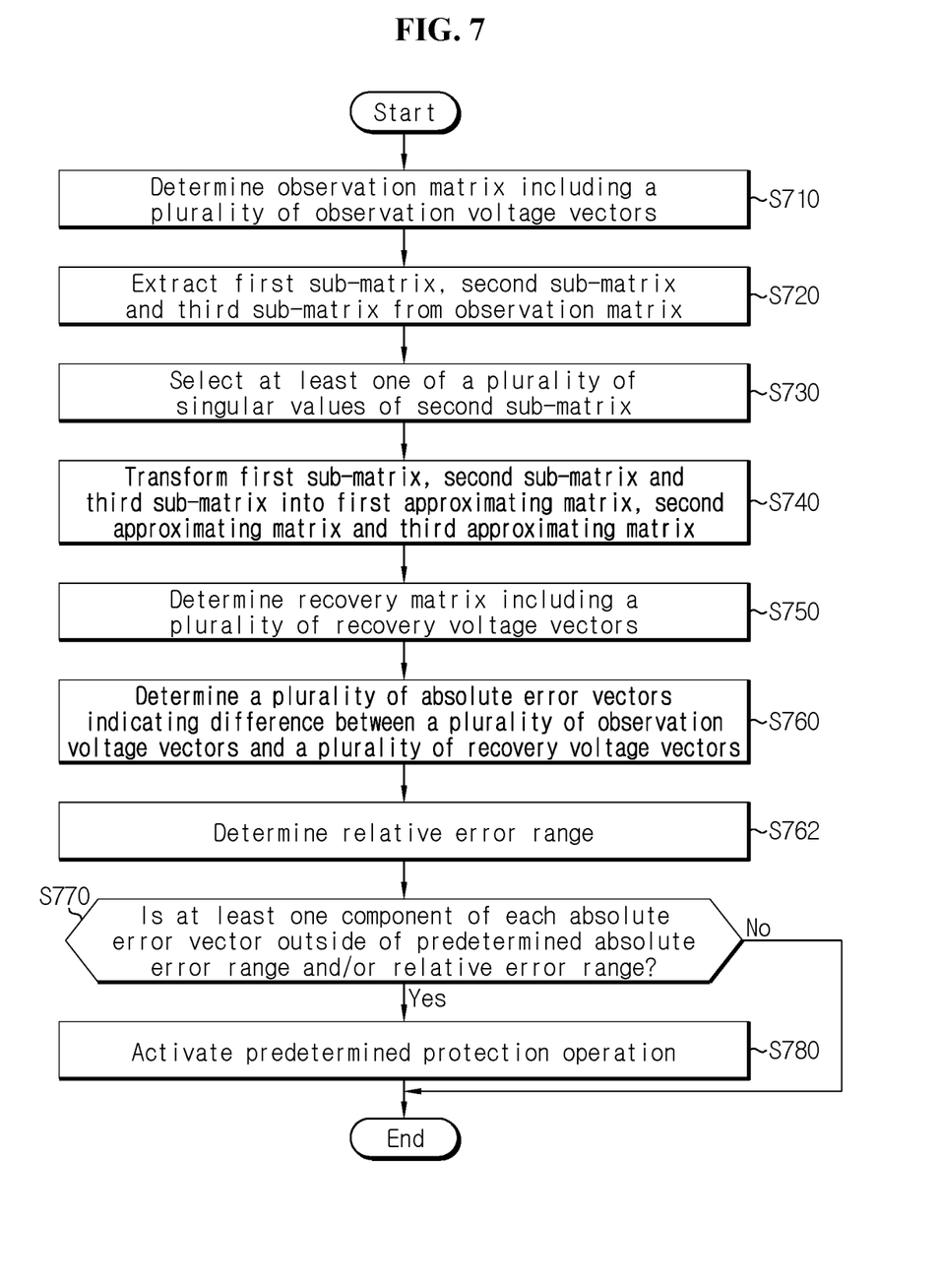
FIG. 7 is a flowchart exemplarily showing a battery management method according to a first embodiment of the present disclosure.

FIG. 7 is a flowchart exemplarily showing a battery management method according to a first embodiment of the present disclosure. The method of FIG. 7 may be repeated at a predetermined time interval.

Referring to FIGS. 1 to 7, in step S710, the control unit 140 determines an observation matrix X including a plurality of observation voltage vectors $X_1 \sim X_n$. The plurality of observation voltage vectors $X_1 \sim X_n$ indicates a voltage history of each of a plurality of battery cells $BC_1 \sim BC_n$ in the moving window 200 having a predetermined size.

In step S720, the control unit 140 extracts a first sub-matrix A including a plurality of principal component vectors $A_1 \sim A_m$, a second sub-matrix B including a plurality of singular values $b_{11} \sim b_{nn}$ indicating the descriptive factor of each of the plurality of principal component vectors $A_1 \sim A_n$ and a third sub-matrix $C^T$ including a plurality of coefficient vectors $C_1^T \sim C_n^T$ from the observation matrix X, using a matrix decomposition algorithm. That is, the control unit 140 decomposes the observation matrix X in the form of multiplication of the first sub-matrix A, the second sub-matrix B and the third sub-matrix $C^T$ by applying the matrix decomposition algorithm to the observation matrix X.

In step S730, the control unit 140 selects at least one of the plurality of singular values $b_{11} \sim b_{nn}$ of the second sub-matrix B. The selection of the singular value may use at least one of the above-described recovery conditions.

In step S740, the control unit 140 transforms the first sub-matrix A, the second sub-matrix B and the third sub-matrix $C^T$ into a first approximating matrix A', a second approximating matrix B' and a third approximating matrix $C^{T'}$, respectively, based on the at least one selected singular value $b_{11} \sim b_{ww}$.

In step S750, the control unit 140 determines a recovery matrix X' including a plurality of recovery voltage vectors $X_1'$~$X_n'$ corresponding to the plurality of observation voltage vectors $X_1$~$X_n$ in a one-to-one relationship by multiplying the first approximating matrix A', the second approximating matrix B' and the third approximating matrix $C^{T\prime}$.

In step S760, the control unit 140 determines a plurality of absolute error vectors indicating a difference between the plurality of observation voltage vectors $X_1$~$X_n$ and the plurality of recovery voltage vectors $X_1'$~$X_n'$. The plurality of absolute error vectors corresponds to the plurality of observation voltage vectors $X_1$~$X_n$ in a one-to-one relationship.

In step S762, the control unit 140 determines a relative error range $R_2$ based on the plurality of absolute error vectors. Since each absolute error vector has m elements, the control unit 140 may determine m relative error ranges $R_2$ corresponding to the m elements of each absolute error vector, i.e., a vector of the relative error range $R_2$. The step S762 may be selectively omitted from the method of FIG. 7.

In step S770, the control unit 140 determines whether at least one element of each absolute error vector is outside of a predetermined absolute error range $R_1$ and/or the relative error range $R_2$. A value of the step S770 being "Yes" indicates that at least one battery cell BC is detected as defective. For example, since the element $\Delta V_{ij}$ of the $j^{th}$ absolute error vector 610 is outside of both the absolute error range $R_1$ and the relative error range $R_2$ at the time point $t_i$ in the moving window 200 as shown in FIG. 6, the control unit 140 may determine that the $j^{th}$ battery cell $BC_j$ is defective.

In step S780, the control unit 140 activates a predetermined protection operation. In an example, the control unit 140 turns off the switch 20. In another example, the control unit 140 outputs a diagnosis message indicating information (for example, identification number) of each battery cell BC detected as defective. The interface unit 150 may transmit the diagnosis message to the high level controller 2 or output visual and/or audible information corresponding to the diagnosis message.

Figure 8:
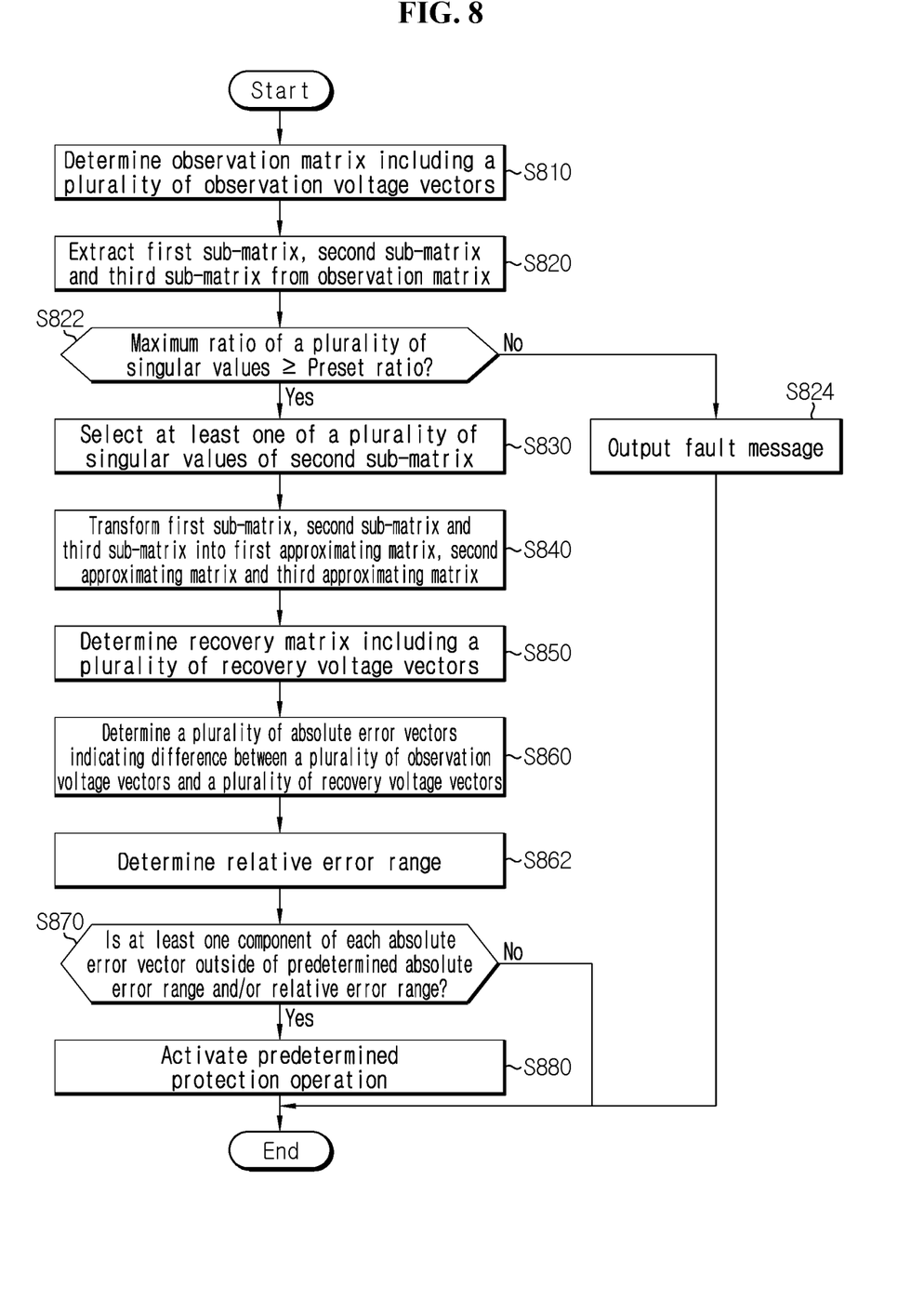
FIG. 8 is a flowchart exemplarily showing a battery management method according to a second embodiment of the present disclosure.

FIG. 8 is a flowchart exemplarily showing a battery management method according to a second embodiment of the present disclosure.

In the method of FIG. 8, steps S810 to S880 are the same as the steps S710 to S780 of FIG. 7, and a redundant description is omitted.

The method of FIG. 8 is different from the method of FIG. 7 since the method of FIG. 8 further includes steps S822 and S824.

In step S822, the control unit 140 determines whether a maximum ratio of the plurality of singular values $b_{11}$~$b_{mm}$ is equal to or larger than a preset ratio. The maximum ratio is a ratio of the maximum value $b_{11}$ to the minimum value $b_{nn}$ among the plurality of singular values $b_{11}$~$b_{mm}$. A value of the step S822 being "No" indicates that there is no principal component vector having a descriptive factor that is large enough to use in the voltage recovery from the observation matrix X to the recovery matrix X' among the plurality of principal component vectors $A_1$~$A_n$. When the value of the step S822 is "No", the method moves to the step S824. When the value of the step S822 is "Yes", the method moves to the step S830.

In step S824, the control unit 140 outputs a fault message. The fault message indicates a recovery impossible situation in the plurality of observation voltage vectors. The interface unit 150 may transmit the fault message to the high level controller 2 or output visual and/or audible information corresponding to the fault message.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A battery management system for detecting an abnormality of each of a plurality of battery cells connected in series, the battery management system comprising:
    a voltage measurement circuit configured to generate a voltage signal indicating a cell voltage of each battery cell; and
    a controller configured to determine an observation matrix including a plurality of observation voltage vectors indicating a voltage history of each of the plurality of battery cells measured multiple times in time series in a moving window having a predetermined size based on the voltage signal,
    wherein the controller is configured to:
    determine a recovery matrix including a plurality of recovery voltage vectors corresponding to the plurality of observation voltage vectors in a one-to-one relationship,
    determine a plurality of absolute error vectors indicating a difference between the plurality of observation voltage vectors and the plurality of recovery voltage vectors, and
    detect the abnormality of each of the plurality of battery cells based on the plurality of absolute error vectors, and
    wherein, based on the detected abnormality of each of the plurality of battery cells, the control unit is configured to control a charging or discharging of at least one of the plurality of battery cells.

2. The battery management system according to claim 1, wherein the controller is configured to:
    extract a first sub-matrix, a second sub-matrix and a third sub-matrix from the observation matrix using a matrix decomposition algorithm,
    wherein the first sub-matrix is an orthogonal matrix including a plurality of principal component vectors indicating variance information of the observation matrix,
    wherein the second sub-matrix is a diagonal matrix including a plurality of singular values indicating descriptive factor information of the plurality of principal component vectors for the variance information, and wherein the third sub-matrix is an orthogonal matrix including a plurality of coefficient vectors indicating dependency information of the plurality of observation voltage vectors on the plurality of principal component vectors, select at least one of the plurality of singular values using a predetermined recovery condition, transform the first sub-matrix, the second sub-matrix and the third sub-matrix into a first approximating matrix, a second approximating matrix and a third approximating matrix based on the at least one selected singular value, and determine the plurality of recovery voltage vectors by multiplying the first approximating matrix, the second approximating matrix and the third approximating matrix.

3. The battery management system according to claim 2, wherein the controller is further configured to select a threshold number of singular values from the plurality of singular values in a descending order.

4. The battery management system according to claim 2, wherein the controller is configured to select first to $k^{th}$ singular values from the plurality of singular values when a ratio of the $k^{th}$ singular value to a sum of the plurality of singular values is equal to or larger than a first threshold ratio and a ratio of a $u^{th}$ singular value to the sum of the plurality of singular values is less than the first threshold ratio, and k is a natural number of less than n, u is k+1, n is a total number of the plurality of battery cells, and the $k^{th}$ singular value is a $k^{th}$ largest singular value among the plurality of singular values.

5. The battery management system according to claim 2, wherein the controller is configured to select first to $q^{th}$ singular values from the plurality of singular values when a ratio of a sum of the first to $q^{th}$ singular values to a sum of the plurality of singular values is equal to or larger than a second threshold ratio and a ratio of a sum of the first to $p^{th}$ singular values to the sum of the plurality of singular values is less than the second threshold ratio, and q is a natural number of 2 or greater and less than n, p is q−1, n is a total number of the plurality of battery cells, and the $q^{th}$ singular value is a $q^{th}$ largest singular value among the plurality of singular values.

6. The battery management system according to claim 1, wherein the controller is configured to detect that each battery cell corresponding to each absolute error vector including at least one component outside of a predetermined absolute error range among the plurality of absolute error vectors is defective.

7. The battery management system according to claim 6, wherein the controller is configured to:

determine a relative error range based on the plurality of absolute error vectors, and detect that each battery cell corresponding to each absolute error vector including the at least one component outside of the relative error range among the plurality of absolute error vectors is defective.

8. The battery management system according to claim 1, wherein the controller is configured to output a fault message indicating a recovery impossible situation when a ratio of a maximum value to a minimum value among a plurality of singular values is less than a preset ratio.

9. A battery pack comprising the battery management system according to claim 1.

10. An energy storage system comprising the battery pack according to claim 9.

11. A battery management method for detecting an abnormality of each of a plurality of battery cells connected in series, the battery management method comprising:

determining an observation matrix including a plurality of observation voltage vectors indicating a voltage of each of the plurality of battery cells measured multiple times in time series in a moving window having a predetermined size;

determining a recovery matrix including a plurality of recovery voltage vectors corresponding to the plurality of observation voltage vectors in a one-to-one relationship;

determining a plurality of absolute error vectors indicating a difference between the plurality of observation voltage vectors and the plurality of recovery vectors;

detecting the abnormality of each of the plurality of battery cells based on the plurality of absolute error vectors; and managing the plurality of battery cells based on the detected abnormality of each of the plurality of battery cells, wherein, based on the detected abnormality of each of the plurality of battery cells, the managing the plurality of battery cells includes controlling a charging or discharging of at least one of the plurality of battery cells.

* * * * *